(12) United States Patent
Liu et al.

(10) Patent No.: US 12,224,340 B2
(45) Date of Patent: Feb. 11, 2025

(54) HETEROJUNCTION SEMICONDUCTOR DEVICE WITH LOW ON-RESISTANCE

(71) Applicants: SOUTHEAST UNIVERSITY, Nanjing (CN); CSMC TECHNOLOGIES FAB2 CO., LTD., Wuxi (CN)

(72) Inventors: Siyang Liu, Wuxi (CN); Chi Zhang, Wuxi (CN); Kui Xiao, Wuxi (CN); Guipeng Sun, Wuxi (CN); Dejin Wang, Wuxi (CN); Jiaxing Wei, Wuxi (CN); Li Lu, Wuxi (CN); Weifeng Sun, Wuxi (CN); Shengli Lu, Wuxi (CN)

(73) Assignees: SOUTHEAST UNIVERSITY, Nanjing (CN); CSMC TECHNOLOGIES FAB2 CO., LTD., Wuxi (CN)

( * ) Notice: Subject to any disclaimer, the term of this patent is extended or adjusted under 35 U.S.C. 154(b) by 602 days.

(21) Appl. No.: 17/417,663

(22) PCT Filed: Dec. 19, 2019

(86) PCT No.: PCT/CN2019/126517
§ 371 (c)(1),
(2) Date: Jun. 23, 2021

(87) PCT Pub. No.: WO2020/135207
PCT Pub. Date: Jul. 2, 2020

(65) Prior Publication Data
US 2022/0069115 A1 Mar. 3, 2022

(30) Foreign Application Priority Data
Dec. 24, 2018 (CN) .......................... 201811585004.5

(51) Int. Cl.
*H01L 29/778* (2006.01)
*H01L 29/20* (2006.01)
(Continued)

(52) U.S. Cl.
CPC ...... *H01L 29/7788* (2013.01); *H01L 29/2003* (2013.01); *H01L 29/205* (2013.01); *H01L 29/207* (2013.01)

(58) Field of Classification Search
CPC ... H01L 29/7788; H01L 29/0611–0623; H01L 29/66431; H01L 29/66462; H01L 29/778–7787; H01L 29/0623–0684
See application file for complete search history.

(56) References Cited

U.S. PATENT DOCUMENTS 6,181,723 B1  1/2001  Okubo et al.
8,343,823 B2  1/2013  Hersee et al.
(Continued)

FOREIGN PATENT DOCUMENTS

CN  102881716 A  1/2013
CN  102945859 A  2/2013
(Continued)

OTHER PUBLICATIONS

Chinese Office Action for corresponding CN Application No. CN App No. 201811585004.5, dated Jul. 29, 2021, 8 pages.
(Continued)

*Primary Examiner* — Syed I Gheyas
*Assistant Examiner* — Casey Paul Boatman
(74) *Attorney, Agent, or Firm* — Dority & Manning, P.A.

(57) ABSTRACT

A heterojunction semiconductor device with a low on-resistance includes a metal drain electrode, a substrate, and a buffer layer. A current blocking layer is arranged in the buffer layer, a gate structure is arranged on the buffer layer, and the gate structure comprises a metal gate electrode, GaN pillars and AlGaN layers, wherein a metal source electrode is arranged above the metal gate electrode; and the current blocking layer comprises multiple levels of current blocking layers, the centers of symmetry of the layers are collinear,
(Continued)

and annular inner openings of the current blocking layers at all levels gradually become smaller from top to bottom. The AlGaN layers and the GaN pillars are distributed in a honeycomb above the buffer layer.

15 Claims, 6 Drawing Sheets

(51) Int. Cl.
*H01L 29/205* (2006.01)
*H01L 29/207* (2006.01)

(56) References Cited

U.S. PATENT DOCUMENTS

| | | | |
|---|---|---|---|
| 2006/0057790 A1* | 3/2006 | Clarke | H01L 29/7789 257/E29.253 |
| 2008/0001159 A1* | 1/2008 | Ota | H01L 29/66143 257/E29.198 |
| 2009/0057684 A1 | 3/2009 | Otake et al. | |
| 2011/0169012 A1 | 7/2011 | Hersee et al. | |
| 2012/0181548 A1 | 7/2012 | Okada et al. | |
| 2012/0225526 A1 | 9/2012 | Hersee et al. | |
| 2013/0316507 A1 | 11/2013 | Saitoh et al. | |
| 2017/0373200 A1* | 12/2017 | Shibata | H01L 29/812 |
| 2018/0151715 A1 | 5/2018 | Chowdhury et al. | |
| 2020/0144194 A1* | 5/2020 | Constant | H01L 21/02057 |
| 2020/0411679 A1* | 12/2020 | Ogawa | H01L 29/7789 |

FOREIGN PATENT DOCUMENTS

| | | | |
|---|---|---|---|
| CN | 103026491 | A | 4/2013 |
| CN | 104992971 | | 10/2015 |
| CN | 105304707 | A | 2/2016 |
| CN | 105762078 | | 7/2016 |
| CN | 105845724 | | 8/2016 |
| CN | 106340535 | A * | 1/2017 |
| CN | 107146811 | | 9/2017 |
| CN | 107154435 | | 9/2017 |
| CN | 107170820 | | 9/2017 |
| CN | 108598163 | | 9/2018 |

OTHER PUBLICATIONS

PCT International Search Report (w/ English Translation) and Written Opinion for corresponding PCT Application No. PCT/CN2019/126517, mailed on Mar. 18, 2020, 8 pages.

Extended European Search Report for corresponding Application No. PCT/CN2019/126517, dated Aug. 26, 2022, 10 pages.

* cited by examiner

HETEROJUNCTION SEMICONDUCTOR DEVICE WITH LOW ON-RESISTANCE

CROSS REFERENCE TO RELATED APPLICATION

The present application is a national phase entry of International Patent Application No. PCT/CN2019/126517, filed on Dec. 19, 2019, which, in turn, claims priority to Chinese Patent Application No. 201811585004.5, entitled "HETEROJUNCTION SEMICONDUCTOR DEVICE WITH LOW ON-RESISTANCE", filed on Dec. 24, 2018, the contents of both of which are hereby incorporated herein by reference in their entirety.

TECHNICAL FIELD

The present disclosure generally relates to the field of high-voltage power semiconductor devices, and more particularly, to a heterojunction semiconductor device with low on-resistance.

BACKGROUND

Gallium nitride (GaN), as a representation of the third-generation wide bandgap semiconductor, has good electrical characteristics, including higher reverse withstand voltage capability, higher two-dimensional electron gas concentration, higher high temperature working capability, lower forward on-resistance, higher switching frequency, higher power density, and the like. The heterojunction semiconductor is a heterojunction formed by contacting two kinds of semiconductor materials having different bandgap widths, and electrons flow from the semiconductor having a wider bandgap to the semiconductor having a narrower bandgap, such that a quantum well is formed on a cross section of the semiconductor at a side of the semiconductor having the narrower bandgap. The electrons in the heterojunction semiconductor are less influenced by coulomb scattering of impurities in the semiconductor having the wider bandgap, so that the heterojunction semiconductor has higher electron mobility. AlGaN/GaN-based heterojunction semiconductor has been widely used in semiconductor field.

A vertical heterojunction semiconductor device has advantages over a lateral heterojunction semiconductor device in that, the vertical heterojunction semiconductor device can withstand voltage through a buffer layer, while the lateral heterojunction semiconductor device withstands voltage mainly relying on an active region between a metal gate electrode and a metal drain electrode. Under a same withstand voltage capability, the vertical heterojunction semiconductor device occupies a smaller lateral area than the lateral heterojunction semiconductor device, which accelerates the development of the heterojunction semiconductor device in the direction of miniaturization and integration. However, the vertical heterojunction semiconductor device cannot directly realize a current conduction between the source electrode and the drain electrode through a high mobility two-dimensional electron gas as what the lateral heterojunction semiconductor device do, and the current must flow through the buffer layer, which greatly increases an on-resistance of the device. However, increasing the concentration of the buffer layer will cause the problem of a decrease in the withstand voltage capability of the device. Therefore, a main problem of the vertical heterojunction semiconductor device is that there is a relatively large on-resistance.

SUMMARY

In view of the above problems, the present disclosure proposes a heterojunction semiconductor device with low on-resistance, which effectively improves the forward conduction capability of the device, reduces the on-resistance of the device, while maintaining a higher reverse withstand voltage value of the device.

The present disclosure adopts the following technical solutions.

A heterojunction semiconductor device with low on-resistance includes: a metal drain electrode, a substrate disposed on the metal drain electrode, a buffer layer disposed on the substrate, a current blocking layer disposed within the buffer layer, a gate structure disposed on the current blocking layer and including a metal gate electrode, a metal source electrode disposed above the metal gate electrode, a first passivation layer disposed between the metal gate electrode and the metal source electrode, and a second passivation layer disposed between the metal gate electrode and the buffer layer. The current blocking layer includes a first-level annular current blocking layer, a second-level annular current blocking layer, and a third-level annular current blocking layer which are sequentially arranged from top to bottom, and symmetry centers of each of the layers are collinear. An annular inner opening of the first-level annular current blocking layer is larger than an annular inner opening of the second-level annular current blocking layer, and the annular inner opening of the second-level annular current blocking layer is larger than an annular inner opening of the third-level annular current blocking layer, presenting a trend of becoming smaller level by level.

A heterojunction semiconductor device with low on-resistance includes:
a metal drain electrode;
a substrate disposed on the metal drain electrode;
a buffer layer disposed on the substrate;
a current blocking layer disposed within the buffer layer;
a heterojunction structure disposed on the buffer layer;
a gate structure disposed on the buffer layer; and
a metal source electrode disposed on the buffer layer.

Where, the current blocking layer includes a first-level annular current blocking layer, a second-level annular current blocking layer, and a third-level annular current blocking layer which are sequentially arranged from top to bottom, and symmetry centers of each of the annular current blocking layers are collinear. An annular inner opening of the first-level annular current blocking layer is larger than an annular inner opening of the second-level annular current blocking layer, and the annular inner opening of the second-level annular current blocking layer is larger than an annular inner opening of the third-level annular current blocking layer.

The details of one or more embodiments of the present disclosure are set forth in the accompanying drawings and description below. Other features, purposes and advantages of the present disclosure will become apparent from the description, the accompanying drawings, and the claims.

BRIEF DESCRIPTION OF THE DRAWINGS

To better describe and illustrate embodiments and/or examples of the disclosure disclosed herein, reference can be made to one or more accompanying drawings. The additional details or examples used to describe the accompanying drawings should not be construed as limiting the scope of any of the disclosed disclosure, the presently described embodiments and/or examples, and the presently understood preferred mode of the present disclosure.

DETAILED DESCRIPTION OF THE EMBODIMENTS

In order to facilitate the understanding of the present disclosure, the present disclosure will be described more fully hereinafter with reference to the related accompanying drawings. Preferable embodiments of the present disclosure are presented in the accompanying drawings. However, the present disclosure may be embodied in many different forms and is not limited to the embodiments described herein. Rather, these embodiments are provided so that the understanding of the content of the present disclosure will be more thorough.

All technical and scientific terms used herein have the same meaning as commonly understood by one of ordinary skill in the art to which this disclosure applies, unless otherwise defined. The terms used in the specification of present disclosure herein are for the purpose of describing specific embodiments only and are not intended to limit the present disclosure. The term "and/or" used herein includes any and all combinations of one or more of the associated listed items.

It should be understood that, when an element or layer is described as being "on", "adjacent to", "connected to" or "coupled to" another element or layer, it can be directly on, adjacent to, connected to, or coupled to the other element or layer, or there can be an intermediate element. In contrast, when an element is described as being "directly on", "directly adjacent to", "directly connected to", or "directly coupled to" another element or layer, there is no intermediate element or layer. It should be understood that, although the terms of "first", "second", "third", and so on can be used to describe various elements, components, regions, layers and/or portions, these elements, components, regions, layers and/or portions should not be limited by these terms. These terms are merely used to distinguish an element, component, region, layer or portion from another element, component, region, layer or portion. Thus, the first element, component, region, layer or portion discussed below can be described as a second element, component, region, layer or portion without departing from the teachings of the present disclosure.

Terms used herein are for the purpose of describing specific embodiments only and are not intended to be limiting of the present disclosure. As used herein, "a", "one" and "said/the" in singular forms are also intended to include a plural form unless the context clearly indicates other forms. It should also be understood that the terms "consist" and/or "include" when used in the description, determine presence of the features, integers, steps, operations, elements and/or components, but do not exclude the presence or addition of one or more other features, integers, steps, operations, elements, components, and/or groups. As used herein, the term "and/or" includes any and all combinations of related listed items.

Figure 1:
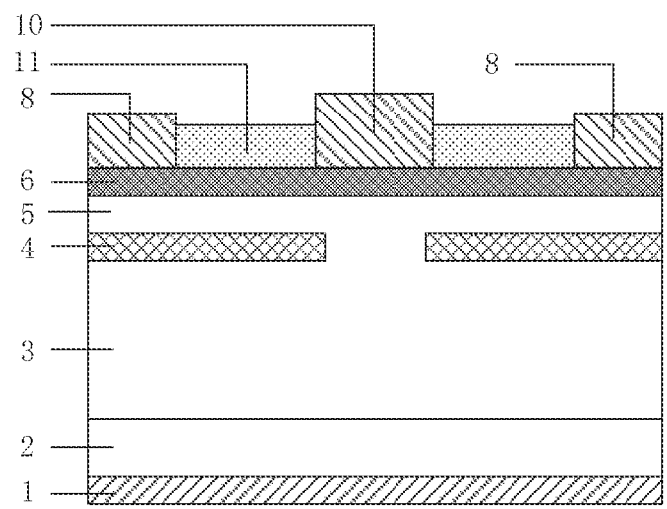
FIG. 1 is a front cross-sectional view of an exemplary vertical heterojunction semiconductor device.
Figure 2:
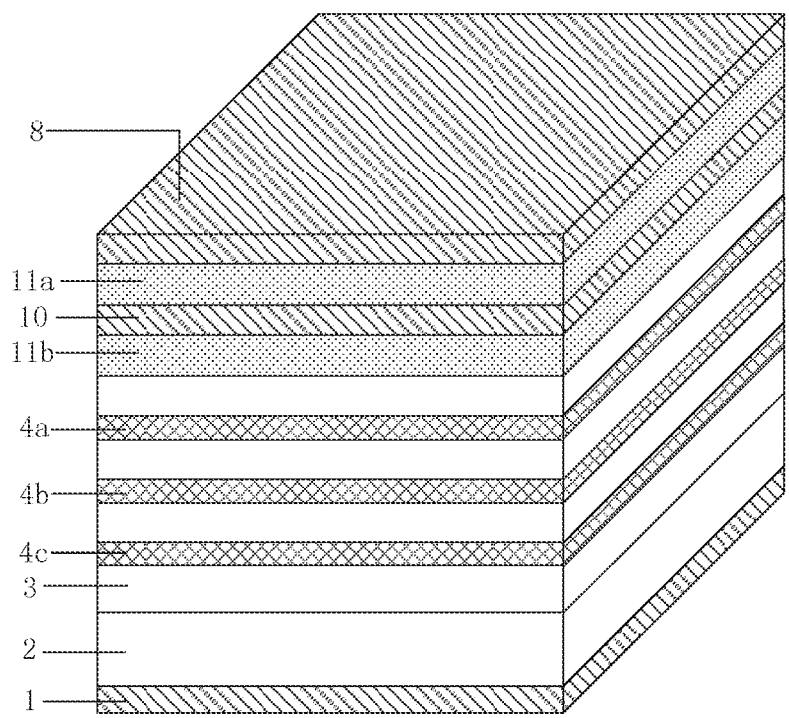
FIG. 2 is a perspective view of a heterojunction semiconductor device with low on-resistance according to Embodiment 1.
Figure 3:
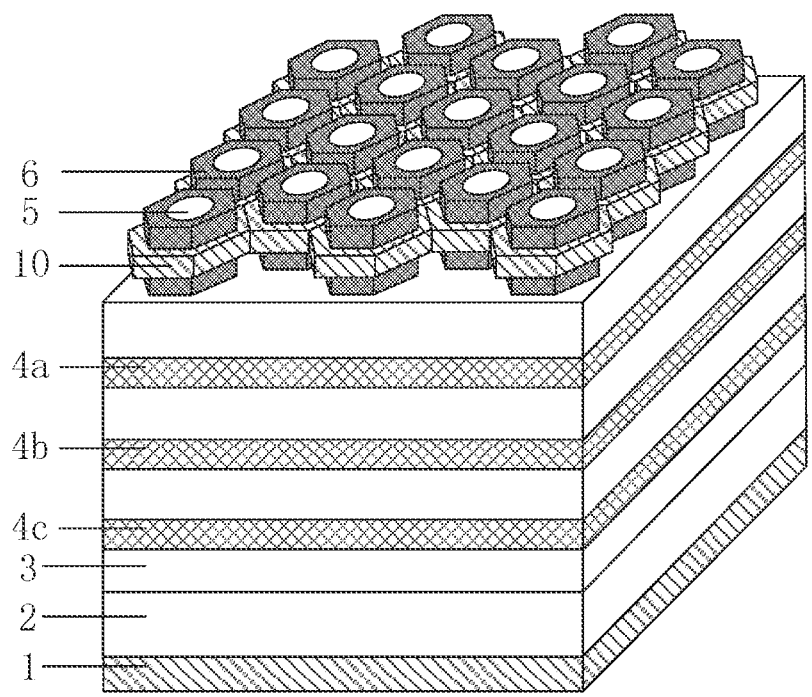
FIG. 3 is a simplified perspective view of the heterojunction semiconductor device with low on-resistance according to Embodiment 1, in which portions of a passivation layer and a metal source electrode of the device are not shown.
Figure 4:
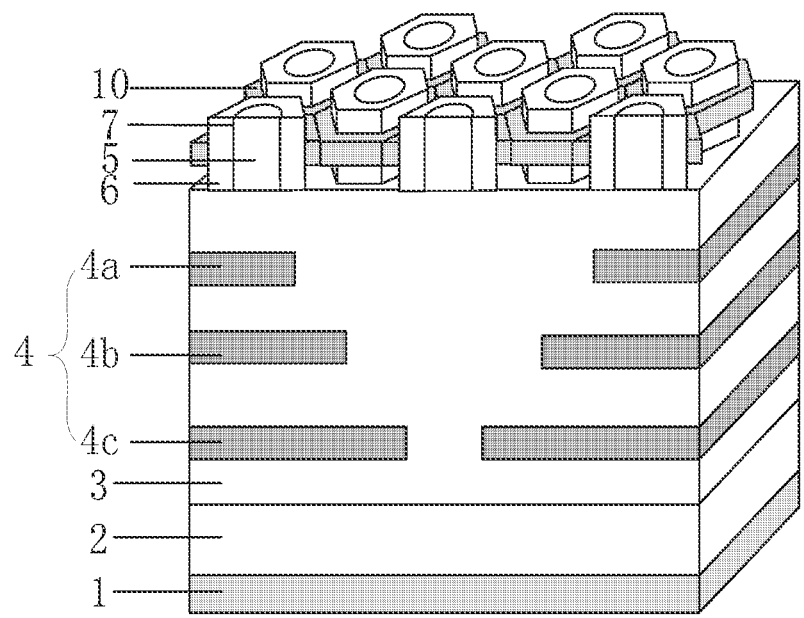
FIG. 4 is a simplified front sectional perspective view of the heterojunction semiconductor device with low on-resistance according to Embodiment 1, in which the portions of the passivation layer and the metal source electrode of the device are not shown.

Solving the on-resistance problem of a vertical heterojunction semiconductor device is a very critical problem. An exemplary vertical GaN heterojunction semiconductor device is shown in FIG. 1, and its device structure mainly includes a metal drain electrode 1, a substrate 2, a GaN buffer layer 3, a GaN pillar 5, an AlGaN layer 6, a current blocking layer 4, a metal source electrode 8, a metal gate electrode 10, and a passivation layer 11. When the device is on, current must flow through the GaN buffer layer 3. The exemplary vertical heterojunction semiconductor device has a significant contradiction between withstand voltage and on-resistance.

The present disclosure provides a heterojunction semiconductor device with low on-resistance, which includes:
   a metal drain electrode 1;
   a substrate 2 disposed on the metal drain electrode 1;
   a buffer layer 3 disposed on the substrate 2;
   a current blocking layer 4 disposed within the buffer layer 3;
   a heterojunction structure disposed on the buffer layer 3;
   a gate structure disposed on the buffer layer 3; and
   a metal source electrode 8 disposed on the buffer layer 3.

The current blocking layer 4 includes a first-level annular current blocking layer 4a, a second-level annular current blocking layer 4b, and a third-level annular current blocking layer 4c, which are sequentially arranged from top to bottom, and symmetry centers of the annular current blocking layers are collinear. An annular inner opening of the first-level annular current blocking layer 4a is larger than an annular inner opening of the second-level annular current blocking layer 4b, and the annular inner opening of the second-level annular current blocking layer 4b is larger than an annular inner opening of the third-level annular current blocking layer 4c.

Figure 8:
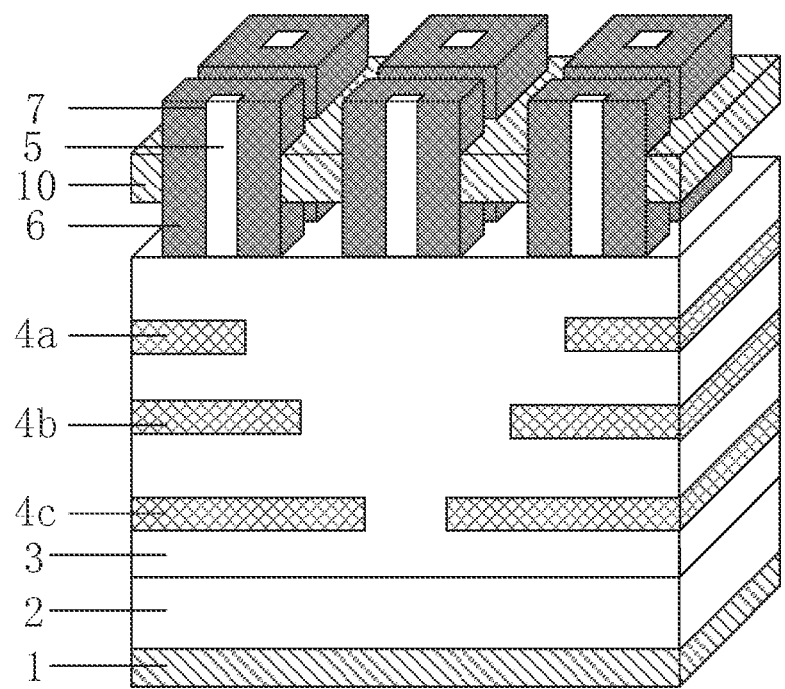
FIG. 8 illustrates a front sectional view of a heterojunction semiconductor device with low on-resistance according to Embodiment 2 of which a gate structure is arranged in a matrix, in which portions of a passivation layer and a metal source electrode of the device are not shown.

The current blocking layer used in the present disclosure is divided into multilevel current blocking layers, where each level of the current blocking layers is distributed in a shape of a "hollow square" in the horizontal plane in which each level is located. The annular inner opening of each level of the current blocking layers becomes smaller level by level from top to bottom, and in addition, each level of the current blocking layers is distributed in a stepped shape in the buffer layer. The current blocking layer in the stepped shape can effectively improve the distribution of an electric field, so that a peak value of the electric field is far away from a channel and the average electric field is increased, thereby ensuring the withstand voltage capability of the device. The current blocking layer nearer to the GaN pillar has a larger annular inner opening, and the current entering the buffer layer through the channel is larger. With the increase of the number of levels of the current blocking layers, the annular inner openings become smaller. The depletion layer limits the flow path of the current, and the current can only flow through the minimum channel opening. As shown in FIG. 8, the electric field distribution diagrams of the current blocking layers with two types of "hollow square" distribution (a type that the annular inner openings become smaller level by level, and a type that the annular inner openings become larger level by level) are compared. The current blocking layers in the stepped shape with the annular inner openings becoming smaller level by level well limits the peak electric field to be far away from the GaN pillar side, and reduces the sacrifices to the forward current conduction capability of the device as much as possible while improving the withstand voltage capability of the device. In addition, an exemplary process of manufacturing a current blocking layer is Mg ion implantation. The Mg ion implantation will cause certain lattice damage, especially will cause a larger electric leakage to the current blocking layer. On the other hand, Mg has a strong memory effect, and has a large diffusion effect in a secondary epitaxy process. The area occupied by the current blocking layers in the stepped shape, especially the current blocking layer nearer to the GaN pillar, is smaller, which can reduce the effect of the Mg ion implantation on a channel layer and a barrier layer, and reduce the electric leakage while alleviating certain current collapse effect.

Embodiments of the present disclosure are further described below.

Embodiment 1

Figure 5:
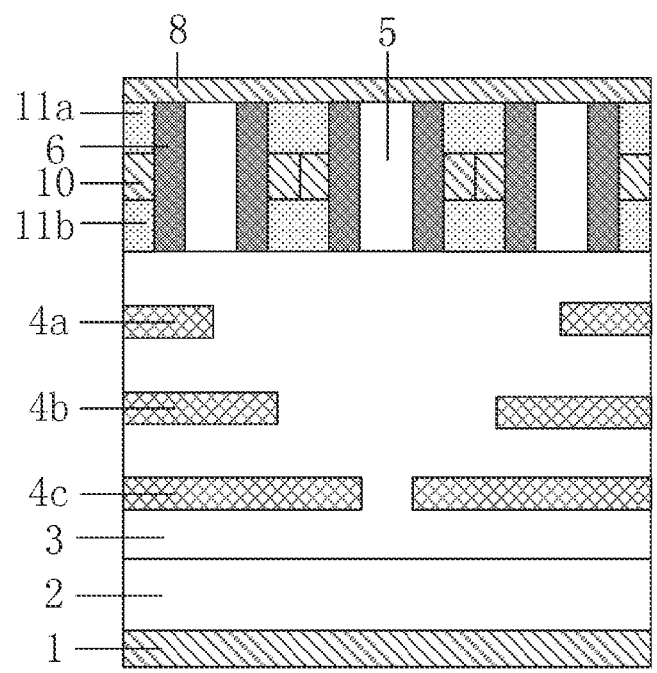
FIG. 5 is a front sectional view of the heterojunction semiconductor device with low on-resistance according to Embodiment 1.
Figure 6:
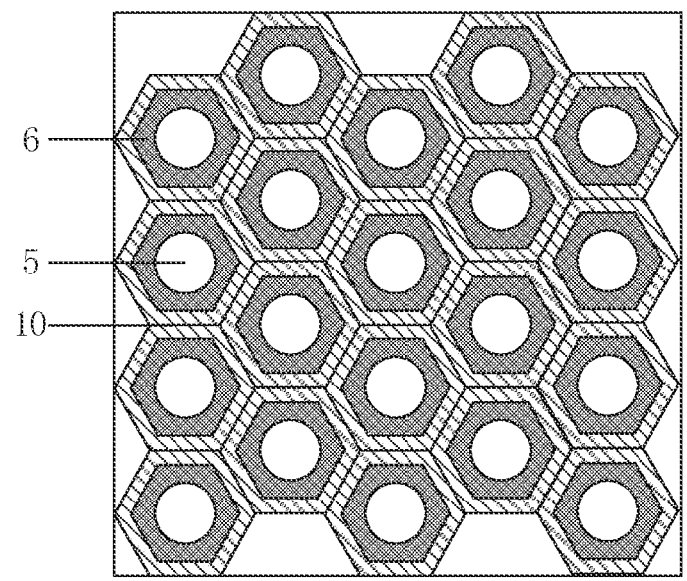
FIG. 6 is a top sectional view of the heterojunction semiconductor device with low on-resistance according to Embodiment 1, in which the portions of the passivation layer and the metal source electrode of the device are not shown.
Figure 7:
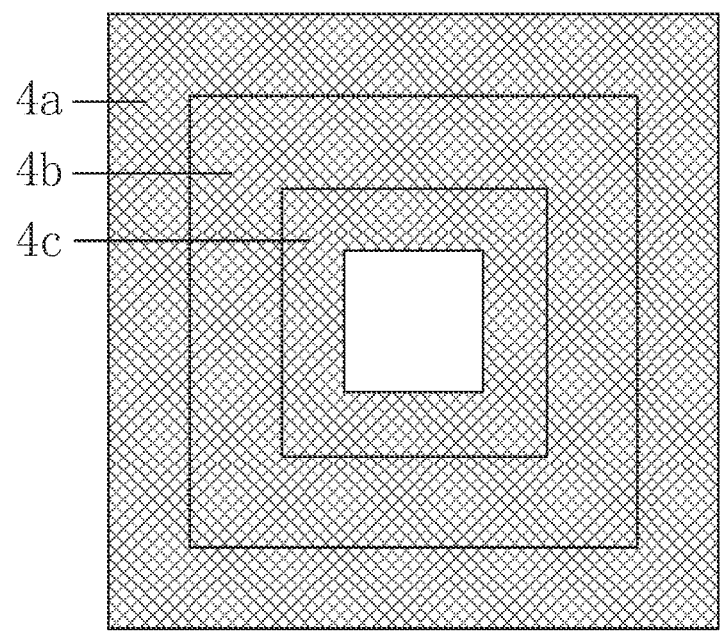
FIG. 7 is a top sectional view of a current blocking layer portion in a buffer layer of the heterojunction semiconductor device with low on-resistance according to Embodiment 1.

Referring to FIGS. 2-6, FIG. 4 shows a front sectional perspective view of a heterojunction semiconductor device with low on-resistance, and FIG. 5 shows a front sectional view of the heterojunction semiconductor device with low on-resistance. In this embodiment, the heterojunction semiconductor device with low on-resistance includes a metal drain electrode 1, a substrate 2 disposed on the metal drain electrode 1, a buffer layer 3 disposed on the substrate 2, a current blocking layer 4 disposed within the buffer layer 3, a gate structure disposed on the current blocking layer 4 and including a metal gate electrode 10, a metal source electrode 8 disposed above the metal gate electrode 10, a first passivation layer 11a disposed between the metal gate electrode 10 and the metal source electrode 8, and a second passivation layer 11b disposed between the metal gate electrode 10 and the buffer layer 3. Referring also to FIG. 7, the current blocking layer 4 includes a first-level annular current blocking layer 4a, a second-level annular current blocking layer 4b, and a third-level annular current blocking layer 4c, which are sequentially arranged from top to bottom, and a symmetry center of each of the layers are collinear. An annular inner opening of the first-level annular current blocking layer 4a is larger than an annular inner opening of the second-level annular current blocking layer 4b, and an annular inner opening of the second-level annular current blocking layer 4b is larger than an annular inner opening of the third-level annular current blocking layer 4c, presenting a trend of becoming smaller level by level.

In this embodiment, the gate structure includes a GaN pillar 5 standing on an upper surface of the buffer layer 3, an AlGaN layer 6 wrapped on a side surface of the GaN pillar 5, and a vertical channel 7 is formed at an interface between the GaN pillar 5 and the AlGaN layer 6 which are in contact with each other. The metal gate electrode 10 is located on an outer side of the AlGaN layer 6, the metal source electrode 8 is located on upper surfaces of the GaN pillar 5 and the AlGaN layer 6, and a Schottky contact is formed between the metal source electrode 8 and the AlGaN layer 6.

Figure 11:
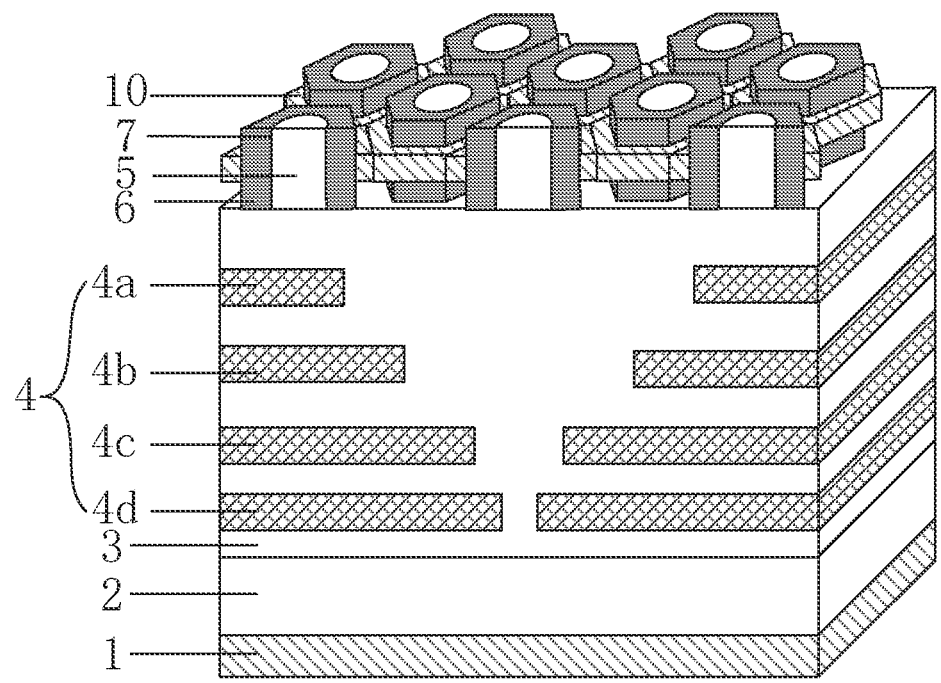
FIG. 11 is a simplified perspective view of another heterojunction semiconductor device with low on-resistance according to Embodiment 1, in which the current blocking layer is of four levels.
Figure 12:
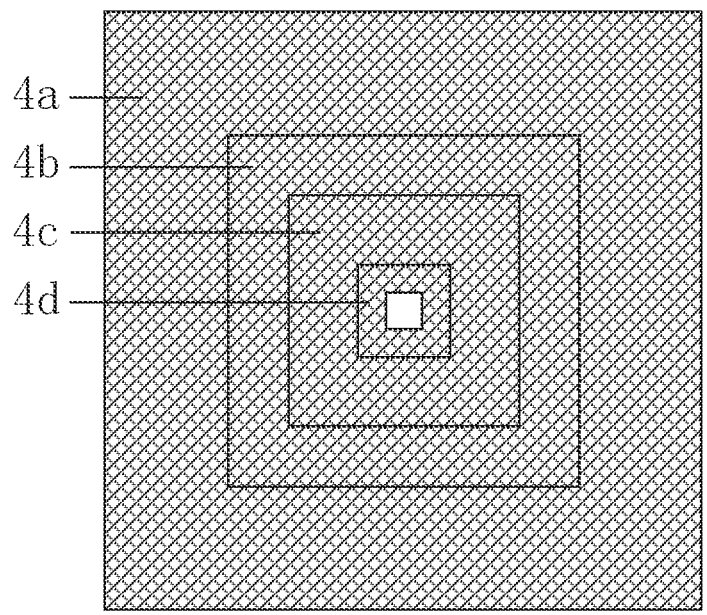
FIG. 12 is a top sectional view of a current blocking layer portion in a buffer layer of the other heterojunction semiconductor device with low on-resistance according to Embodiment 1 in which the current blocking layer is of four levels.

The current blocking layer 4 may include three levels, four levels, five levels or even more levels, and this embodiment employs three levels. Referring to FIGS. 11 and 12, in an embodiment in which the current blocking layer 4 is of four levels, the current blocking layer 4 further includes a fourth-level annular current blocking layer 4d, a symmetry center of the fourth-level annular current blocking layer 4d is collinear with the symmetry center of the third-level annular current blocking layer 4c, and an annular inner opening of the fourth-level annular current blocking layer 4d is smaller than the annular inner opening of the third-level annular current blocking layer 4c. In an embodiment, each level of the current blocking layers are parallel to each other and are distributed in a stepped shape in the buffer layer 3.

The AlGaN layer 6 includes, but is not limited to, a hexagon in a horizontal cross-sectional shape, and includes any other polygonal structures or circular structures. The GaN pillar 5 includes, but is not limited to, a circle in a horizontal cross-sectional shape, and includes any other polygonal structures. A cross section of the AlGaN layer 6 in this embodiment is in a regular hexagonal shape, and at least four AlGaN layers 6 having N-type doped GaN pillars 5 therein are disposed on the upper surface of the buffer layer 3, and each of the AlGaN layers 6 are distributed and arranged in a honeycomb shape.

A vertical distance between a lower surface of the metal gate electrode 10 and an upper surface of the buffer layer 3 is 0.25-0.4 μm, and a thickness of the metal gate electrode 10 is 0.2 μm.

Embodiment 2

Referring to FIG. 8, as compared with Embodiment 1, the gate structure of this embodiment is arranged and distributed in a matrix. The GaN pillars and the AlGaN layers are arranged and distributed in a matrix over the buffer layer, and the GaN pillars and the AlGaN layers are rectangular in horizontal cross-section. Other structures are the same as those of Embodiment 1.

Embodiment 3

Figure 9:
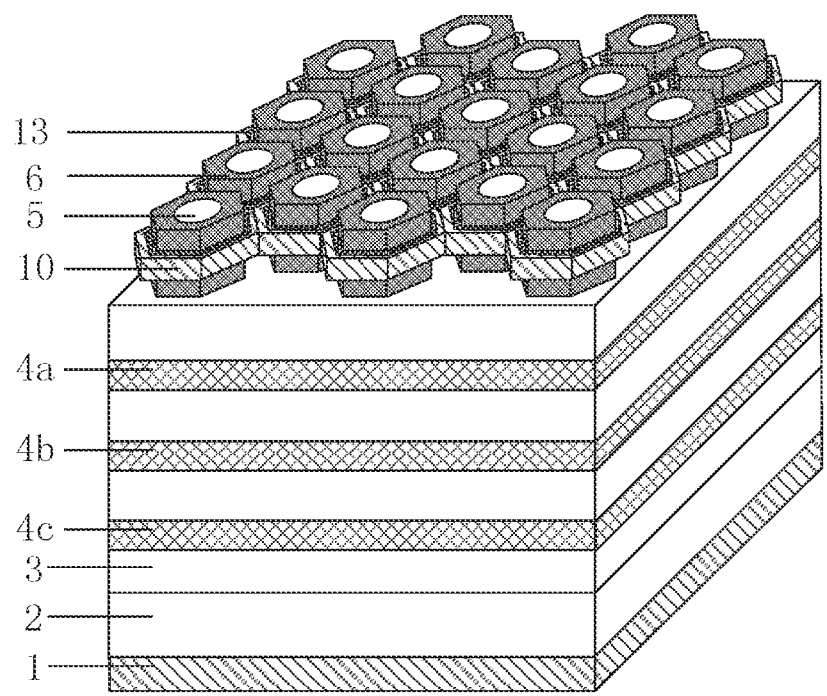
FIG. 9 is a simplified front sectional perspective view of a heterojunction semiconductor device with low on-resistance including a P-type gate according to Embodiment 3, in which portions of a passivation layer and a metal source electrode of the device are not shown.
Figure 10:
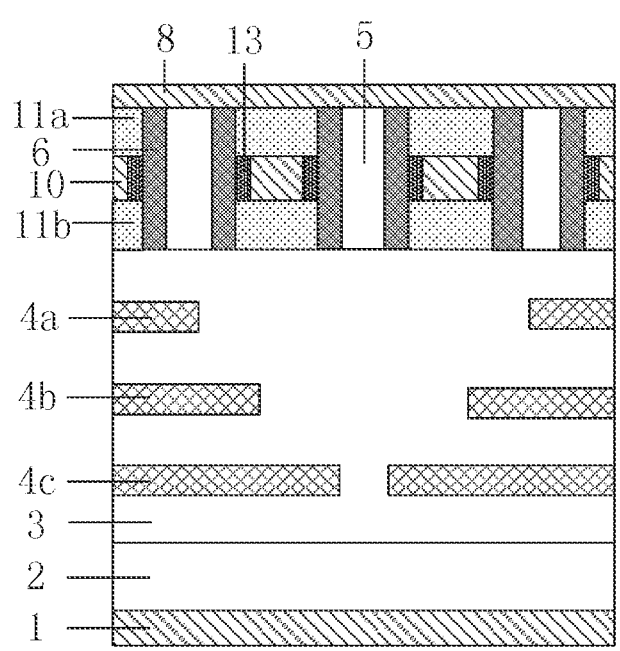
FIG. 10 is a front sectional view of the heterojunction semiconductor device with low on-resistance shown in FIG. 9.

Referring to FIGS. 9 and 10, as compared with Embodiment 1, the gate structure of this embodiment is a P-type gate structure. A P-type GaN cap layer 13 is present between the metal gate electrode 10 and the AlGaN layer 6, and other structures are the same as those of Embodiment 1. The P-type gate structure realizes a normally-off channel.

Compared with the prior art, the present disclosure has the following advantages.

(1) In the present disclosure, the GaN pillar and the AlGaN layer are in contact with each other to form two-dimensional electron gas, which greatly reduce the required lateral occupied area of the device. In addition, the side wall of the GaN pillar and the AlGaN layer both have contact surfaces, and the GaN pillar is circular in the horizontal cross-section, so there is a current conduction path on the side wall of the GaN pillar, and the channel density is increased and the current capability is effectively improved, so that a higher on-state current is obtained when the device is on, thereby reducing the on-resistance of the device.

(2) In the present disclosure, the GaN pillars and the AlGaN layers are distributed in a honeycomb shape on the upper surface of the buffer layer, which meets the requirements of the minimum size of the through-hole in the process requirements and can make maximum use of the lateral area of the device. A plurality of discrete GaN pillars exist on the buffer layer to generate a plurality of sections of channel currents, which effectively improves the current capability and enables a higher on-state current when the device is on, thereby reducing the on-resistance of the device.

(3) The current blocking layer used in the present disclosure is divided into multilevel current blocking layers, where each level of the current blocking layers is distributed in a shape of a "hollow square" in the horizontal plane in which each level is located, and the annular inner openings become smaller level by level, and in addition, each level of the current blocking layers is parallel to each other and distributed in a stepped shape in the buffer layer. The current blocking layer in the stepped shape can effectively improve the distribution of the electric field, so that the peak value of the electric field is far away from the channel and the average electric field is increased, thereby ensuring the withstand voltage capability of the device. The current blocking layer nearer to the GaN pillar has a larger annular inner opening, and the current entering the buffer layer through the channel is larger. With the increase of the number of levels of the current blocking layers, the annular inner openings become smaller. The depletion layer limits the flow path of the current, and the current can only flow through the minimum channel opening. Through software simulation by the inventors, the electric field distribution diagrams of the current blocking layers with two types of "hollow square" distribution (a type that the annular inner openings become smaller level by level, and a type that the annular inner openings become larger level by level) are compared. The current blocking layers in the stepped shape with the annular inner openings becoming smaller level by level well limits the peak electric field to be far away from the GaN pillar side, and reduces the sacrifices to the forward current conduction capability of the device as much as possible while improving the withstand voltage capability of the device. In addition, an exemplary process of manufacturing a current blocking layer is Mg ion implantation. The Mg ion implantation will cause certain lattice damage, especially will cause a larger electric leakage to the current blocking layer. On the other hand, Mg has a strong memory effect, and has a large diffusion effect in the secondary epitaxy process. The area occupied by the current blocking layers in the stepped shape, especially the current blocking layer nearer to the GaN pillar, is smaller, which can reduce the effect of the Mg ion implantation on the channel layer and the barrier layer, and reduce the electric leakage while alleviating certain current collapse effect.

(4) In the present disclosure, the vertical GaN pillar and the AlGaN layer are in contact with each other to form two-dimensional electron gas, the length of the channel is not affected by the lateral area of the device itself, the short-channel effect is overcome, so that the characteristic frequency of the device is significantly increased, and the advantage of higher operating frequency of the GaN material is fully exerted.

(5) The exemplary heterojunction semiconductor structure has obvious current collapse phenomenon under high voltage. The present disclosure has a characteristic that the longitudinal channel and the substrate are not in the same direction, and the defects of the substrate portion have little influence on the device channel under high voltage. The structure of the present disclosure can effectively alleviate the current collapse effect.

The aforementioned embodiments merely represent several embodiments of the present disclosure, and the description thereof is more specific and detailed, but they should not be construed as limiting the scope of the present disclosure. It should be noted that, several modifications and improvements may be made for those of ordinary skill in the art without departing from the concept of the present disclosure, and these are all within the protection scope of the present disclosure. Therefore, the protection scope of the present disclosure shall be subject to the appended claims.

What is claimed is:

1. A heterojunction semiconductor device with low on-resistance comprising:
   a metal drain electrode, a substrate disposed on the metal drain electrode, a buffer layer disposed on the substrate, a current blocking layer disposed within the buffer layer, a gate structure disposed on the buffer layer and comprising a metal gate electrode, a metal source electrode disposed above the metal gate electrode, a first passivation layer disposed between the metal gate electrode and the metal source electrode, and a second passivation layer disposed between the metal gate electrode and the buffer layer;
   wherein the current blocking layer comprises a first-level current blocking layer, a second-level current blocking layer, and a third-level current blocking layer which are sequentially arranged from top to bottom, the first-level current blocking layer is continuous as one whole piece and has only one inner opening when viewed in plan-view, the second-level current blocking layer is continuous as one whole piece and has only one inner opening when viewed in plan-view, and the third-level current blocking layer is continuous as one whole piece and has only one inner opening when viewed in plan-view, and symmetry centers of the first-level current blocking layer, the second-level current blocking layer, and the third-level current blocking layer are collinear;
   the inner opening of the first-level current blocking layer is larger than the inner opening of the second-level current blocking layer, and the inner opening of the second-level current blocking layer is larger than the inner opening of the third-level current blocking layer, presenting a trend of becoming smaller level by level.

2. The heterojunction semiconductor device with low on-resistance according to claim 1, wherein the gate structure further comprises a GaN pillar standing on an upper surface of the buffer layer, and an AlGaN layer wrapped on a side surface of the GaN pillar, a vertical channel being formed at an interface between the GaN pillar and the AlGaN layer in contact with each other; the metal gate electrode is located on an outer side of the AlGaN layer, the metal source electrode is located on upper surfaces of the GaN pillar and the AlGaN layer, and a Schottky contact is formed between the metal source electrode and the AlGaN layer; and wherein, the GaN pillar and the AlGaN layer form a heterojunction structure.

3. The heterojunction semiconductor device with low on-resistance according to claim 1, wherein the current blocking layer further comprises a fourth-level current blocking layer located below the third-level annular current blocking layer, a symmetry center of the fourth-level current blocking layer is collinear with the symmetry center of the third-level current blocking layer, and an inner opening of the fourth-level current blocking layer is smaller than the inner opening of the third-level current blocking layer.

4. The heterojunction semiconductor device with low on-resistance according to claim 2, wherein a cross section of the AlGaN layer is in a regular hexagonal shape, and at least four AlGaN layers having N-type doped GaN pillars therein are disposed on the upper surface of the buffer layer and are distributed and arranged in a honeycomb shape.

5. The heterojunction semiconductor device with low on-resistance according to claim 1, wherein a vertical distance between a lower surface of the metal gate electrode and an upper surface of the buffer layer is 0.25 μm to 0.4 μm, and a thickness of the metal gate electrode is 0.2 μm.

6. A heterojunction semiconductor device with low on-resistance, comprising:
   a metal drain electrode;
   a substrate disposed on the metal drain electrode;
   a buffer layer disposed on the substrate;
   a current blocking layer disposed within the buffer layer;
   a gate structure disposed on the buffer layer; and
   a metal source electrode disposed on the buffer layer;
   wherein, the current blocking layer comprises a first-level current blocking layer, a second-level current blocking layer, and a third-level current blocking layer which are sequentially arranged from top to bottom, the first-level current blocking layer is continuous as one whole piece and has only one inner opening when viewed in plan-view, the second-level current blocking layer is continuous as one whole piece and has only one inner opening when viewed in plan-view, and the third-level current blocking layer is continuous as one whole piece and has only one inner opening when viewed in plan-view, and symmetry centers of the first-level current blocking layer, the second-level current blocking layer, and the third-level current blocking layer are collinear;
   the inner opening of the first-level current blocking layer is larger than the inner opening of the second-level current blocking layer, and the inner opening of the second-level current blocking layer is larger than the inner opening of the third-level current blocking layer.

7. The heterojunction semiconductor device with low on-resistance according to claim 6, wherein the gate structure comprises:
   a GaN pillar standing on an upper surface of the buffer layer;
   an AlGaN layer wrapping the GaN pillar on a side surface of the GaN pillar, a vertical channel being formed at an interface between the AlGaN layer and the GaN pillar in contact with each other; and
   a metal gate electrode disposed on an outer side of the AlGaN layer;
   wherein the metal source electrode is located above the metal gate electrode and on upper surfaces of the GaN pillar and the AlGaN layer, and a Schottky contact is formed between the metal source electrode and the AlGaN layer; and
   wherein, the GaN pillar and the AlGaN layer form a heterojunction structure.

8. The heterojunction semiconductor device with low on-resistance according to claim 7, further comprising:
   a first passivation layer disposed between the metal gate electrode and the metal source electrode; and
   a second passivation layer disposed between the metal gate electrode and the buffer layer.

9. The heterojunction semiconductor device with low on-resistance according to claim 7, wherein a cross section of the AlGaN layer is in a regular hexagonal shape, and at least four AlGaN layers having GaN pillars therein are disposed on the upper surface of the buffer layer, and each of the AlGaN layers are distributed and arranged in a honeycomb shape.

10. The heterojunction semiconductor device with low on-resistance according to claim 9, wherein the GaN pillars are N-type doped GaN pillars.

11. The heterojunction semiconductor device with low on-resistance according to claim 7, wherein the GaN pillars and the AlGaN layers are arranged in a matrix over the buffer layer, and the GaN pillars and the AlGaN layers are rectangular in horizontal cross-section.

12. The heterojunction semiconductor device with low on-resistance according to claim 7, wherein the gate structure further comprises a P-type doped GaN cap layer disposed between the metal gate electrode and the AlGaN layer.

13. The heterojunction semiconductor device with low on-resistance according to claim 7, wherein a vertical distance between a lower surface of the metal gate electrode and an upper surface of the buffer layer is 0.25 μm to 0.4 μm, and a thickness of the metal gate electrode is 0.2 μm.

14. The heterojunction semiconductor device with low on-resistance according to claim 6, wherein the current blocking layer is formed by Mg ion implantation.

15. The heterojunction semiconductor device with low on-resistance according to claim 6, wherein the current blocking layer further comprises a fourth-level current blocking layer located below the third-level current blocking layer, a symmetry center of the fourth-level current blocking layer is collinear with the symmetry center of the third-level current blocking layer, and an inner opening of the fourth-level current blocking layer is smaller than the inner opening of the third-level current blocking layer.

* * * * *